(12) United States Patent
Hsu et al.

(10) Patent No.: US 6,700,161 B2
(45) Date of Patent: Mar. 2, 2004

(54) VARIABLE RESISTOR STRUCTURE AND METHOD FOR FORMING AND PROGRAMMING A VARIABLE RESISTOR FOR ELECTRONIC CIRCUITS

(75) Inventors: Louis Lu-Chen Hsu, Fishkill, NY (US); Chandrasekhar Narayan, Hopewell Junction, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 10/146,072

(22) Filed: May 16, 2002

(65) Prior Publication Data

US 2003/0213998 A1 Nov. 20, 2003

(51) Int. Cl.[7] ........................... H01L 29/73; H01L 23/62
(52) U.S. Cl. ..................... 257/358; 257/209; 257/363
(58) Field of Search ................. 257/358, 209, 257/363

(56) References Cited

U.S. PATENT DOCUMENTS 4,581,628 A * 4/1986 Miyauchi et al. ........... 257/529
6,202,198 B1 * 3/2001 Bibyk .......................... 716/17
6,356,496 B1 * 3/2002 Carroll et al. ............ 365/225.7

* cited by examiner

Primary Examiner—Jasmine Clark
(74) Attorney, Agent, or Firm—Connolly Bove Lodge & Hutz LLC; Robert M. Trepp; Larry J. Hume

(57) ABSTRACT

A non-ablative structure and method for forming a variable resistor includes providing a programmable resistive element including two or more different conductive materials, and changing a resistance of the programmable resistive element to a finite value by heating the programmable element by either providing a current flow through the programmable element, or directing a laser beam onto the programmable element. The conductive materials are interdiffused to form an alloy of the conductive materials. A resistance value of the variable resistor is determined, at least in part, by the degree to which the conductive materials are alloyed or interdiffused. The method and structure of the variable resistor prevents ablative damage to adjoining circuit structure, allowing tighter pitch, and has application to digital programmable elements, and to resistance trimming for impedance matching in RF integrated circuits.

70 Claims, 4 Drawing Sheets

Example of Non-Ablative Variable Resistor Before Alloying

VARIABLE RESISTOR STRUCTURE AND METHOD FOR FORMING AND PROGRAMMING A VARIABLE RESISTOR FOR ELECTRONIC CIRCUITS

BACKGROUND OF THE INVENTION

1. Field of the Invention

The present invention relates to a structure and method for forming a controllably variable resistor having wide application to a variety of unique digital and analog circuits, including both programmable digital integrated circuit devices, and programmable analog integrated circuit devices.

The present invention even more particularly relates to a structure and method for forming and setting a programmable resistive element such as a fuse or antifuse used in programming digital integrated circuit devices including redundant memory elements, for example. This invention also relates to a programmable or trimming resistor used in analog RF circuit tuning applications. More specifically, this disclosure relates to a structure and method for non-ablatively forming a fuse, antifuse, or trimming resistor element without ablation by selectively altering resistivity of the variable resistor to a finite value.

2. Description of Related Art

The continued progress in improving integrated circuit (IC) performance, either by device scaling or by more efficient utilization of chip area, is directed to allowing faster and smaller devices to be manufactured, as well as to allowing a reduction in manufacturing process time and expense, both during manufacture of the semiconductor device itself, as well as during the testing of the device.

Traditionally, programmable devices or devices incorporating redundant circuitry are manufactured to provide end-user flexibility in the ultimate application of the device, and/or to increase production yield. Applications, which often use such redundant circuitry or programmable elements, include, for example, programmable logic arrays (PLA) or dynamic random access memory (DRAM) devices.

Fuses are employed in integrated circuits to encode or "program" information on a circuit chip at the time of manufacture. A fusible link, or "fuse", is one that provides a closed or low resistance connection when first formed, and which is modified to provide an open or high resistance circuit when programmed.

The encoded information is used to later identify the chip, to enable or tune circuits depending on test results, or to repair defective regions of the chip by enabling spare or redundant circuits. The redundant circuitry can be selectively removed from the final device configuration by the use of fusible conductive links, or fuses.

In the case of fusible conductive links, an ablative approach is often used to provide flexibility and improve production yield. However, there is an area penalty incurred on the chip by the inclusion of the redundant circuitry, and damage may result to the surrounding circuitry.

The typical method for providing fuses is to form small conductive paths that can be selectively ablated with a precisely positioned laser beam, or by providing a current that is high enough to melt the conductive material. Such, ablation of the conductive link encodes the necessary information as a series of bits, or selectively enables or disables one or more circuits in the integrated circuit. A drawback with this method is that the area required by the region damaged by ablation is relatively large, so that features and devices cannot be fabricated near the fuses. Another drawback with laser-ablated fuses is that they do not scale well with lithography.

The ablative damage associated with such a fuse blowing process typically extends at least a few microns around the fuse, and often extends into the top few layers of the so-called "back-end-of-the-line" (BEOL) structure. BEOL processing, also known in the industry as "back end", generally is considered to include steps from contact to the semiconductor substrate through completion of the wafer, prior to electrical test. Structure resulting from back-end processing may include, for example, addition of insulating or conductive material, e.g., Copper (Cu) used in high performance processors, and dielectric insulators such as silicon dioxide.

The damage to such back-end structures poses reliability concerns, such as the electrical shorting of elements that the manufacturer does not intend to be shorted. Damage resulting from blowing fuses also imposes limits on the proximity of adjacent fuses, and hence fuse pitch reduction which directly affects circuit packing density, and which may be cumulative to the area penalty imposed by the inclusion of the redundant circuitry. Typical fuse pitches are limited to the range of 3 to 10 $\mu$m, are conventionally available, with a fuse pitch of greater than 3 $\mu$m being common in processes that open or "blow" the fusible links ablatively.

The damage and debris that occurs around the programmed link after ablation can limit the achievable pitch in manufacturing the device and, consequently, the level of integration and miniaturization. Therefore, both the ultimate scalability and reliability of the device are necessarily affected adversely by conventional approaches to programming a fuse. The technology used for integrated circuit manufacturing is migrating to low k and ultra low k materials which are mechanically very weak and very susceptible to damage from disruptive fuse programming like ablation. Non-ablative fuses can play an important role for advanced CMOS interconnect technology.

The use of fusible links for device personalization has further inherent limitations. Specifically, the fuse link can only be blown open or left closed; they cannot be used to close a previously opened link. Personalization where a previously open connection is made closed requires another approach.

Redundant circuitry can be selectively added to the final device configuration by the use of antifusible links, or "antifuses", which are structures that, when first fabricated, are an open or high resistance circuit. When the antifuse is "programmed" the open circuit becomes closed, and conduction across the antifuse becomes possible. Thus, antifuses are used to perform the opposite and complementary function of a fuse.

In the case of either using a fuse or antifuse to program a device, making such discretionary connections alters the function or operating characteristics of integrated circuits. Typically, when a sufficient voltage called a "fusing voltage" is applied across an antifuse structure, the resulting current flow and energy imparted into the fuse element causes the structure to change into an electrically conductive state, or become permanently shorted, and an electrical connection is made. Antifuses are also used in a wide variety of applications, including Field Programmable Gate Arrays (FPGA).

Conventional antifuse technology has several disadvantages. For example, many conventional antifuses require specific metal types to be used as electrodes. These metals are not always compatible with common fabrication technologies. For example, some conventional approaches require a transparent electrode, and thus cannot use electrodes consisting of aluminum or polysilicon, which are opaque. Furthermore, these antifuse structures generally require 12–15 volts to fuse the antifuse. Applying such a voltage to the antifuse can also cause damage to other circuit elements, and thus these antifuses may be incompatible with modem low-voltage semiconductor devices that commonly operate at 3.3 volts or 2.5 volts. Additionally, these structures will be difficult to scale to the significantly smaller sizes that will be required as semiconductor device density increases, for similar reasons to those noted with respect to fuse pitch reduction limits imposed by ablative damage to adjacent BEOL structure.

In other applications, for example, radio frequency (RF) integrated circuit applications, impedance matching between devices and circuits is very important to ensure that a low VSWR is attained, so that proper operation of the circuits can be maintained. As various semiconductor devices are usually incorporated into such an RF integrated circuit, the interactions between the various signals present and the numerous devices can be complex, and correcting for the various device impedances to match to a conductive signal path through the device can be challenging.

Trim resistors which require laser trimming or cutting are often employed, but such trimming techniques pose the same problems in terms of area penalty and damage to surrounding structure from the ablation of the conductive material as in the case of a digital programmable element.

Therefore, what is needed then is an improved structure and method for forming a variable resistor element which reduces processing time and which improves reliability. What is further needed is a non-ablative structure and method for varying a resistor element's value in applications, which, for example, program a fuse element, or to match impedance, and which reduces or eliminates the damage imposed upon surrounding structure. What is still further needed is a structure and method for programming a variable resistor element, which has improved reliability, and which allows fuse and antifuse elements or other circuitry to be positioned on a tighter pitch, thereby reducing the chip area penalty incurred by redundant circuitry or impedance matching or trimming resistors.

SUMMARY OF THE INVENTION

The present invention solves the aforementioned problems relating to maintaining the reliability of back-end structure, as well as preventing damage of adjacent structures and hence enabling the reduction the required fuse pitch and area penalty associated with variable resistors used as fuses or antifuses to select or deselect redundant circuitry, as well as the problems associated with adjusting impedance trimming resistors.

A new method and structure for forming a variable resistor and non-ablatively adjusting or trimming a resistance value of the variable resistor has been discovered. The process is non-ablative, as opposed to traditional laser or current ablative techniques, so that reliability of the device is improved. The process is also cleaner than conventional ablative approaches, and the elimination of damage to the surrounding area allows the fuses or resistive elements to be positioned on a tighter pitch, thereby reducing the penalty in area required for redundant circuitry, or for trimming resistors.

In one embodiment of the invention, a non-ablative method of programming an integrated circuit device includes providing a programmable element including at least two conductive materials, and changing a resistance of the programmable element to a finite value. The resistance of the programmable element may be changed by heating the programmable element by providing a current flow through the programmable element, or by directing a laser beam onto the programmable element. The current flow may be pulsed, and the number of current pulses applied may be used to determine the resistance of the programmable element. The current flow may also be regulated, or a voltage may be applied across the programmable element. Alternatively, the programmable element could be heated by focusing an ion beam, molecular beam or an electron beam onto the programmable element.

By heating the programmable element to a sufficient degree, the combination of conductive materials may be interdiffused to form an alloy of the conductive materials, which may be, for example, Cu and Ni, which also may be laminated. In addition, more than two conductive materials may be laminated. For example, a layer of Ni could be sandwiched between two layers of Cu.

The conductive materials used are not limited to Cu and Ni and may be, for example, a lamination of at least one pair of materials selected from the group consisting of Cu—Ni, Au—Pd, Au—Pt, and Au—Cu. Also, one of the conductive materials could include a layer of Si, which could be doped, or could be amorphous or polycrystalline silicon.

The resistance of the programmable element may be changed to a finite value that may be increased or decreased relative to an initial value. The resistance may be changed by less than an order of magnitude relative to the initial resistance of the programmable element, or the resistance of the programmable element may be changed to a finite value that is more than an order of magnitude different relative to the initial resistance of the programmable element. Precise resistance change can be guaranteed by tailoring the thickness of the metal layers, because the final composition of the fuse is a function of the thickness ratio of the starting layers. Since the change in resistance is an order of magnitude, the amount of time required for the associated electrical circuitry to sense the resistive logic state of the programmable element can be made small, and hence programming or setting of the resistance value may be accomplished faster than is conventionally achievable.

In another aspect of this embodiment, a reference resistance element having a resistance approximately equal to an initial resistance of the programmable element is provided. The programmable element may have an initial resistance that is within 50% of a resistance value of the reference resistance element, and the resistance of the programmable element may be changed to a finite value which is decreased by at least an order of magnitude relative to the initial resistance of the programmable element.

In another embodiment, a programmable integrated circuit device includes a bistable element, a variable resistance coupled to the bistable element, and switching means for switching an output state of the bistable element in response to a sensed resistance value of the variable resistance. While the programmable integrated circuit device is in a pre-programmed state, the variable resistance may be a laminate structure two or more conductive materials.

When the programmable integrated circuit device is in a programmed state, the variable resistance may be an interdiffusion of at least two conductive materials, which may be an isomorphous solid solution of at least two conductive materials, or may be an alloy of at least two conductive materials. As in the first embodiment, the two or more conductive materials may include Cu and Ni, or the conductive materials may include at least two materials selected from the group consisting of Cu, Ni, Al, Ti, W, Pd, Pt, Au, Ag, and Si.

A programmed resistance value of the variable resistance may be greater than an initial resistance value of the variable resistance by at least an order of magnitude, or the programmed resistance value of the variable resistance may be greater than an initial resistance value of the programmable element by less than an order of magnitude.

The programmed resistance value of the variable resistance also may be less than a pre-programmed resistance value of the variable resistance by at least an order of magnitude.

In one aspect of this embodiment, the switching means may include an output circuit, a precharge device, a set device, and a read device. The output circuit may be a complementary output circuit, or it may be a single output circuit.

In this embodiment, a reference resistance having a resistance approximately equal to an initial resistance of the programmable element may also be coupled to the bistable element.

In another embodiment, a method of programming a programmable integrated circuit device is disclosed for a programmable integrated circuit device which includes a bistable element, a programmable element including a lamination of at least two conductive materials coupled to the bistable element, a reference resistor coupled to the bistable element which has a resistance value approximately equal to an initial resistance value of the programmable element, an output circuit, a precharge device, a set device, and a read device, wherein a programmed state of the programmable integrated circuit device is determined by a resistance value of the programmable element. The above method includes increasing an initial resistance of the programmable element by approximately an order of magnitude by interdiffusing the lamination of the at least two conductive materials, triggering the set device, latching a data value representing the programmed state into the bistable element, triggering the read device, and reading the programmed state from the bistable element through the output circuit.

Similar to the earlier discussed embodiments, interdiffusing the lamination of the at least two conductive materials may include forming an alloy of Cu and Ni.

In yet another embodiment, a variable resistor is disclosed which includes a resistive element which includes a first conductive material and a second conductive material in contact with the first conductive material. A resistance of the variable resistor is determined at least in part by a relative amount of the second conductive material with respect to an amount of the first conductive material in the resistive element. The resistive element may include a lamination of the first conductive material and the second conductive material. In addition, the resistive element may further include a third conductive material in contact with said second conductive material. The lamination may have the second conductive material sandwiched between the first conductive material and the third conductive material. The first and third conductive materials may be the same type of material. As in the earlier discussed embodiments, the first and second conductive materials may be Cu and Ni, respectively.

Alternatively, the first and second conductive materials may be selected from the group consisting of Cu, Ni, Al, Ti, W, Pd, Pt, Au, Ag, and Si. The variable resistor may have a resistive element which is an alloy of the first and second conductive materials, or an alloy of the first, second, and third conductive materials.

In another embodiment, a method of forming a variable resistor is disclosed which includes providing a first conductive material, providing a second conductive material, and interdiffusing the first and second materials. Interdiffusing may include forming an alloy of the first and second conductive materials.

Controlling a programmed resistance value of the variable resistor may be accomplished, at least in part, by providing the second conductive material in a specified amount relative to the first conductive material, and the first and second conductive materials may be laminated initially. The first and second conductive materials may then be interdiffused by heating. Heating may be accomplished by, for example, either providing an electrical current through the first and second conductive materials, or by non-ablatively exposing a laser beam on the first and second conductive materials.

A second portion of the first conductive material may also be placed in contact with the second conductive material. This may be accomplished by, for example, by laminating the second portion of the first conductive material, the first conductive material, and the second conductive material.

In another embodiment of the invention, a resistance trimming device is disclosed which includes a bi-layer resistive element having a first conductive layer on a second conductive layer, a pair of programming transistors, wherein a first transistor of the pair is arranged between a first voltage and a first end of the bi-layer resistive element. A second transistor of the pair may be arranged between a distal end of the bi-layer resistive element and a second voltage. The first and second transistors may conduct a current through the bi-layer resistive element sufficient to interdiffuse at least a portion of the first conductive layer with the second conductive layer in response to a programming signal applied to each of the first and second transistors.

A trimmed resistance value of the bi-layer resistive element may be determined by a value of the current and the time duration of the programming signal. The current may be a pulsed current, and the number of current pulses provided may determine the trimmed resistance value of the bi-layer resistive element.

In another aspect of this embodiment, a plurality of pairs of programming transistors is provided. Each pair of programming transistors may be connected to the bi-layer resistive element at different respective locations than the first and second transistors. A trimmed resistance value of the bi-layer resistive element may be determined by respective values of a plurality of currents through associated pairs of programming transistors, and time durations of the respective programming signals.

As in previously discussed embodiments, the first conductive layer and the second conductive layer may be Cu and Ni, respectively, or may be pairs of previously mentioned conductive materials.

BRIEF DESCRIPTION OF THE DRAWINGS

In the detailed description of the preferred embodiments presented below, reference is made to the accompanying drawings in which.

DESCRIPTION OF PREFERRED EMBODIMENTS

We have found that a variable resistor having an adjustable, precisely determined value that can be can be reliably and repeatedly manufactured can be obtained by using a lamination of two or more conductive materials, e.g., metals, that are subsequently at least partially alloyed. This non-ablative structure and method overcomes the problems associated with conventional approaches in programmable elements and impedance trimming, as discussed above.

Alloying two metals increases the resistance of the resulting alloy to a value greater than the resistance of either of the base metals. For example, in one embodiment, a lamination of copper (Cu) and nickel (Ni) are interdiffused to increase a resistor having a higher resistance than the original lamination before alloying.

One metal system ideally suited to this invention is the Cu—Ni system. Copper is a preferred metal of choice in BEOL interconnects wiring associated with high performance integrated circuits, especially high performance processors. Nickel is also compatible with BEOL wiring schemes. By using Cu, for example, integrated circuit manufacturers can avoid transitioning between one metal to another in the BEOL interconnect structure.

Figure 1A:
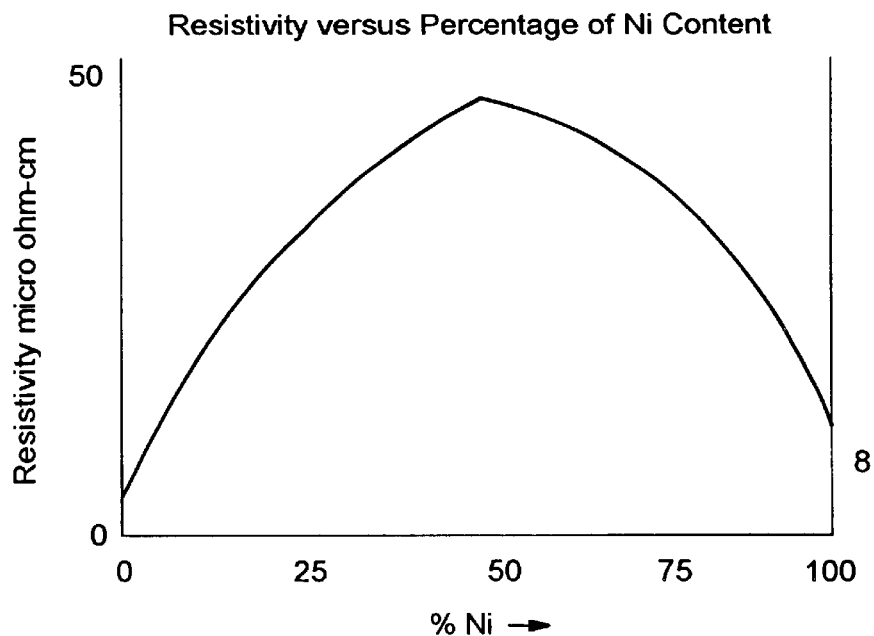
FIG. 1A shows resistivity of a Cu—Ni system in $\mu\Omega$-cm as a function of the percentage of Ni content.

FIG. 1A shows a Cu—Ni phase diagram, which demonstrates the isomorphous nature of this binary system. As a result, Cu and Ni have complete solid solubility in each other, without the formation of any intermediate intermetallic precipitates. As is true for any isomorphous system, the resistivity of the alloy is always higher than the resistivity of either pure metal. This effect is shown in FIG. 1B, where the resistivity of the range of Cu—Ni alloys depicted is shown as a function of the Ni composition of the alloy.

Figure 1B:
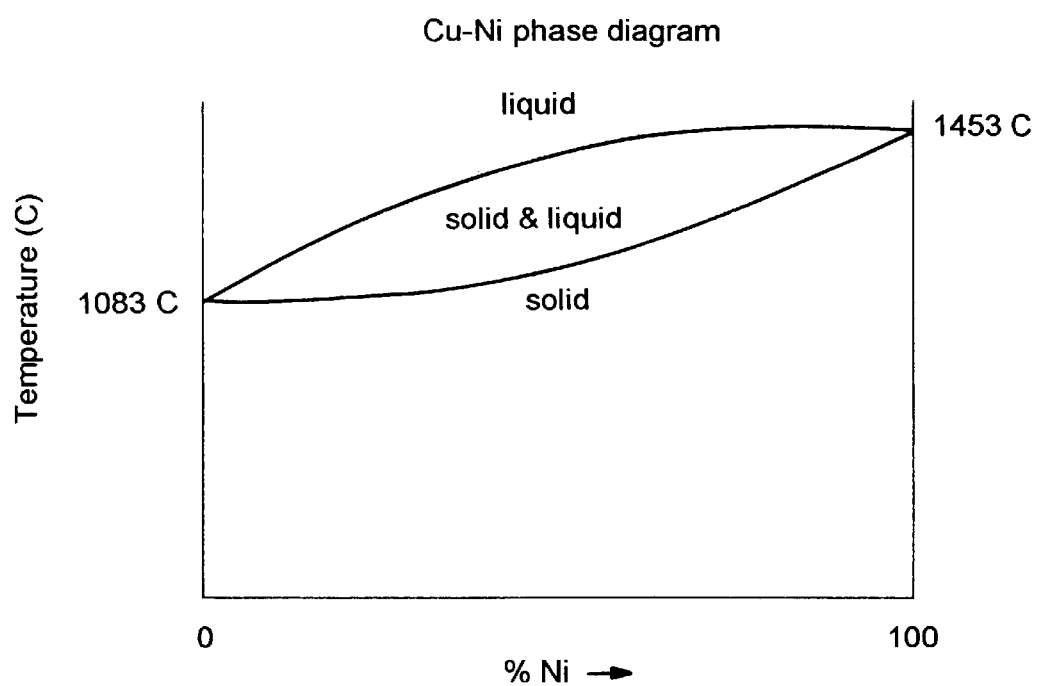
FIG. 1B provides a Cu—Ni phase diagram as a function of the percentage of Ni content in the system.

In FIG. 1B, it is worth noting that, in looking at the binary phase diagram, we can select a fuse (i.e., starting with a lower resistance value) or antifuse (i.e., starting with a higher resistance value) operation by starting with a metal system which lies along the center region of the resistivity curve (higher resistance value), or on an edge of the resistivity curve (lower resistance value). Thermally induced interdiffusion as the metals alloy will push cause a transition of the materials system either away from the center of the resistivity curve, or, from one edge of the resistivity curve towards the center, thus either decreasing or increasing the final value of the alloyed metal system.

Figure 2:
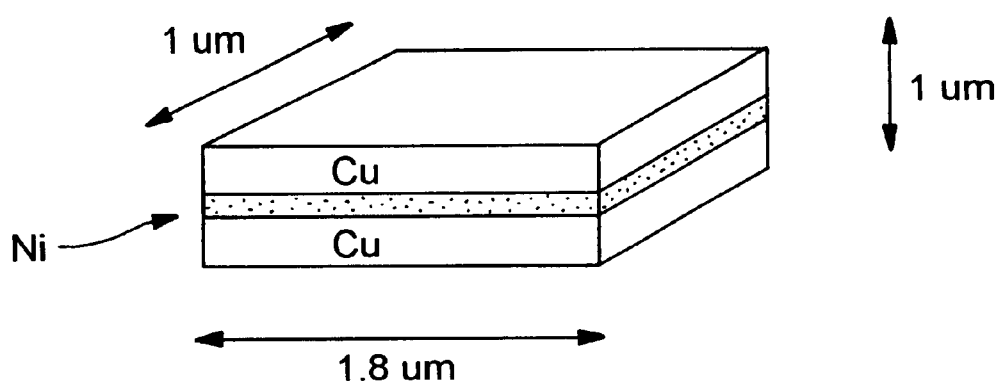
FIG. 2 shows a representative Cu—Ni—Cu lamination of an exemplary embodiment of a non-ablative variable resistor before alloying, according to the invention.

In a preferred embodiment, the variable resistor metallurgy is deposited as a layered, or laminated structure of Cu—Ni, or Cu—Ni—Cu, as shown in FIG. 2. The laminated structure may be formed over in a via or hole, which is in electrical contact with a conductor or device below the surface of a semiconductor device. As discussed above, the use of Cu may provide significant advantages in BEOL processing, by avoiding transitions between different metals in the interconnect structure, as practical, particularly for high-speed processors and ancillary chip sets which may make extensive use of Cu in various ways throughout the interconnect structure.

The layers of Cu and Ni, or other chosen metal systems, in such a laminate structure may be formed by known chemical vapor deposition (CVD), evaporation, plating, physical vapor deposition or sputtering techniques. The thickness of these layers may be controlled to avoid known processing difficulties, and to be compatible with the multilevel interconnects on the chip, and also to be compatible with known interlevel dielectric planarization processes. If the conductive layers are put down too thickly, then it becomes more difficult to planarize the surface.

The lower layer, e.g., Cu, may be in the range of 10–500 nm, or 100–1000 nm, with similar thickness for the middle and top layers. The resistivity of the fuse can be varied, by adjusting the Ni content, in the Cu—Ni metal system.

For variable resistors whose resistance needs to be significantly increased, a laser beam may be used to locally heat the laminated resistor structure to cause interdiffusion between Cu and Ni, thus, for example, raising the resistivity from approximately 1.6 $\mu\Omega$-cm, to greater than 40 $\mu\Omega$-cm, which represents a 25-fold increase in the resistance value. In doing so, the local region of the resistor structure does not see any significant volume change, or generation of ablative byproducts and damage to adjoining regions, thus improving the reliability of the resistance-setting process. Because there is no volume increase, and less damage is done to surrounding circuit regions, the resistive elements may be formed in relatively close proximity to each other, and a significant savings in area may be achieved relative to a conventional ablative laser-blown or electrical fuse.

Although a Cu—Ni metal system provides a classic example of an isomorphous solid solution system, gold (Au) and silver (Ag) are another example of such a system.

In addition to these true isomorphous solid solution systems, other metal systems can also exhibit a similar resistance composition trend, without the formation of specific intermetallics. Such systems include Au—Ni, Au—Pd, Au—Pt, and Au—Cu, for example. These systems show complete solid solubility at some elevated temperature above the solidus in the phase diagram, but exhibit a tendency to spinoidally decompose at lower temperatures, if cooled slowly to simulate true equilibrium conditions.

However, under the conditions described herein, where a laser, for example, is used to spontaneously heat the variable resistor, the cooling rates are equally high, so that true equilibrium conditions never exist, so that these systems will also tend to behave like a true isomorphous system, such as Cu—Ni or Au—Ag, for example.

Examples of the application of bi-layer material interdiffusion via laser or current heating to alter a resistance value of a variable resistor include digital programming of a programmable element used in circuitry which can function as a fuse or an antifuse, and also in trimming of a resistance value to ensure proper impedance matching in analog RF integrated circuit applications, for example.

In one embodiment of the present invention, a non-ablative method of programming an integrated circuit device includes providing a programmable element including at least two conductive materials, and changing a resistance of the programmable element to a finite value. The resistance of the programmable element may be changed by heating the programmable element by providing a current flow through the programmable element, or by directing a laser beam onto the programmable element to cause localized heating of the two conductive materials. The current flow also may be pulsed, and the number of current pulses applied may be controlled to determine the resistance of the programmable element.

Figure 3A:
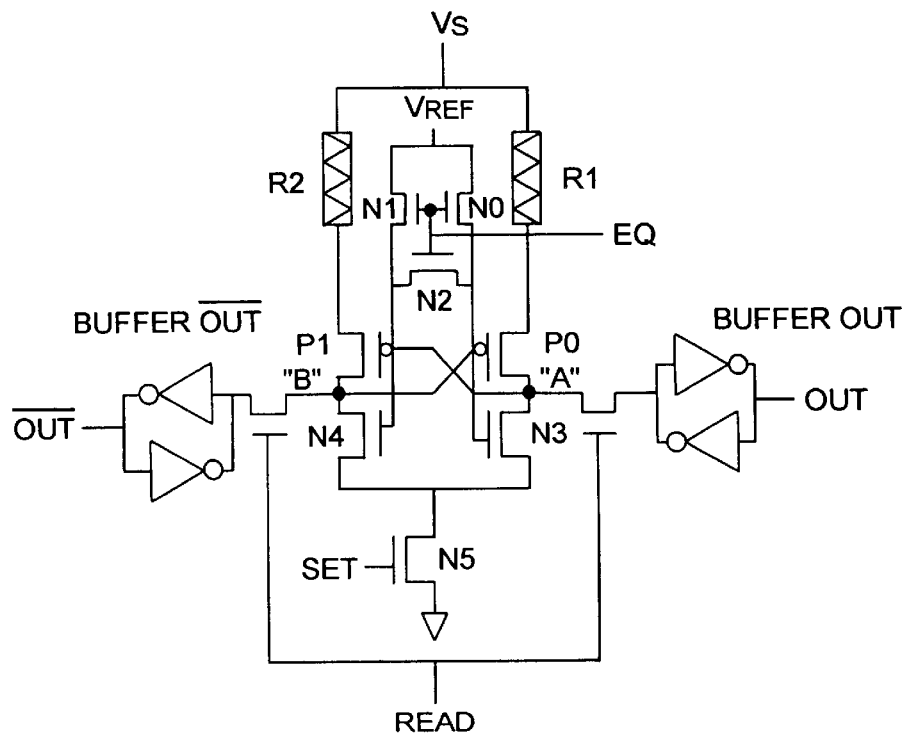
FIG. 3A shows one embodiment of a programmable element having a complementary output fuse circuit.
Figure 3B:
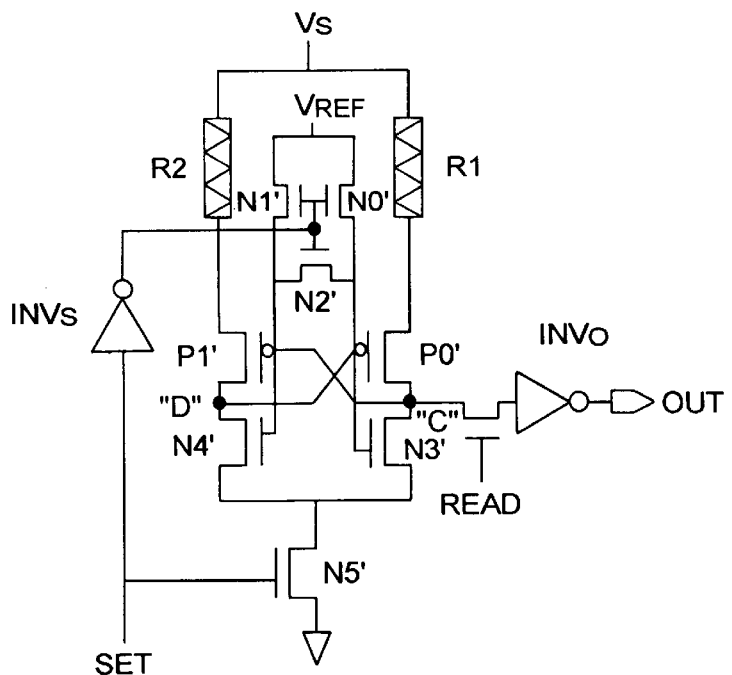
FIG. 3B shows an embodiment of a programmable element having a single output fuse circuit.

In one application, shown in exemplary embodiments depicted in FIGS. 3A and 3B, the novel variable resistor described above has application as a programmable element, which, for example, may be used in a known type of steering circuit to select redundant circuitry or deselect defective circuitry, such as is associated with redundant digital memory arrays.

If a laser, or some other method of local heating, such as relatively high current flow, an ion beam, or an electron beam, or a molecular beam, for example, is used to heat operating resistance R2 such that interdiffusion at least partially occurs, then the resistance of R2 will change. The amount and direction of any such change depends on the constituent parts of the bi-layer resistor, and on the portion of the resistivity curve at which you begin. The content of Ni in a Ni/Cu alloy will be changed by interdiffusion. When the Ni content increases, the resistance of the alloy will first be increased, and then will reach a maximum resistance, after which the resistance of the alloy starts to decrease.

In one embodiment, for example, a layer of Ni/Cu alloy initially in a high-resistivity state may be formed into a laminate structure with an additional Ni or Cu layer(s), which, when interdiffused together, reduces the resistivity of the resulting laminate layered structure. In this case, the Ni/Cu alloy material will be electrically in parallel with the Ni or Cu layer. After interdiffusion, the resistance of the alloy will be decreased, and the Cu or Ni layer resistance will increase due to loss of material into the alloy layer. The resulting decrease in resistance of the alloy layer will not be offset by the associated increase in resistance of the Ni or Cu layer due to loss of material to the alloy layer, because the resistivity of the alloy is a non-linear function of the alloy composition.

For example, a NiCu alloy layer with an effective resistance of 50 k$\Omega$ in parallel with a Ni or Cu layer having an effective resistance of 50 k$\Omega$ will give a total resistance of 25 k$\Omega$. After interdiffusion, the NiCu alloy layer resistance may be reduced from 50 k$\Omega$ to 10 k$\Omega$, and the Cu or Ni layer resistivity may correspondingly be increased to 100 k$\Omega$, resulting in the total final resistance of the system being reduced from 25 k$\Omega$ to 9.1 k$\Omega$.

In FIG. 3A, such a fuse steering circuit having complementary outputs OUT and $\overline{\text{OUT}}$ includes two resistive or "fuse" elements R1 and R2, which may have essentially the same resistance value, at least initially, or which may initially vary significantly from each other in value, up to 50 percent, for example, due to manufacturing process variation. If, for example, R1 is a reference resistance having an initial value of 0.015$\Omega$, and if R2 is an "operating" resistance (or "fuse") having an initial resistance of 0.01$\Omega$, a SRAM-like latch circuit, shown in FIG. 3A may be used to trigger the fuse state, as determined either at OUT or at $\overline{\text{OUT}}$.

With further reference to FIG. 3A, initially, a precharge voltage of, for example, 2.5V, is applied to node "EQ" to equalize the internal nodes in the latch circuit shown, i.e., to help ensure that nodes "A" and "B" are at the same potential, so that the latch is not locked up in an internal state. After equalizing the internal nodes through N0, N1, N2, N3, N4, P0, and P1, a signal is supplied to the SET terminal to latch data relating to the state of the programmable element.

If the operating "fuse" R2 is initially lower in value than the reference resistor R1, internal node "A" will pull higher than the voltage at node "B". Therefore, latch action will force node "A" to $V_S$, and node "B" to ground. Once the data is latched, and while SET is a logical high, at least in this configuration, a logic high signal at the READ terminal will turn on transfer gates N6 and N7, and the truth and complementary data will be shifted to the OUT terminal through BUFFER OUT, and to the $\overline{\text{OUT}}$ terminal through BUFFER $\overline{\text{OUT}}$, respectively.

However, if fusing action by provision of localized heating is taken on operating fuse R2, its resistance value may change by an order of magnitude from, for example, 0.01$\Omega$, to 0.1$\Omega$. Now, since R2 is higher in resistance than the reference resistor R1, the internal nodes "A" and "B" will be latched in the opposite direction and, after enabling the transfer gates, the programmable element's state will be altered, i.e., OUT and $\overline{\text{OUT}}$ will flip states, and the output(s) thus obtained may be used to steer selection of follow-on redundant circuitry (not shown), for example.

Although in this example, the operating fuse resistance changed by an order of magnitude, the circuit could be set up so that less than an order of magnitude change in resistance would be sufficient, by designing the circuit and the various threshold voltages of the devices to provide a desired noise immunity, and the desired circuit noise margin. By reducing the relative amount of resistance change required to program the device, the programming time can be reduced and, by not having to blow the fuse/resistive element, the problem with ablative damage to surrounding structure is eliminated. Further, closer pitch and reduced area objectives are achieved.

Turning now to FIG. 3B, a single output fuse circuit, the operation of this circuit is similar to that described above, except that a logical low signal at the SET terminal acts to equalize the internal nodes of the latch, and there is only one transfer gate activated by the "READ" signal, through which the data is shifted out through inverter $INV_0$ to the OUT terminal.

Figure 4A:
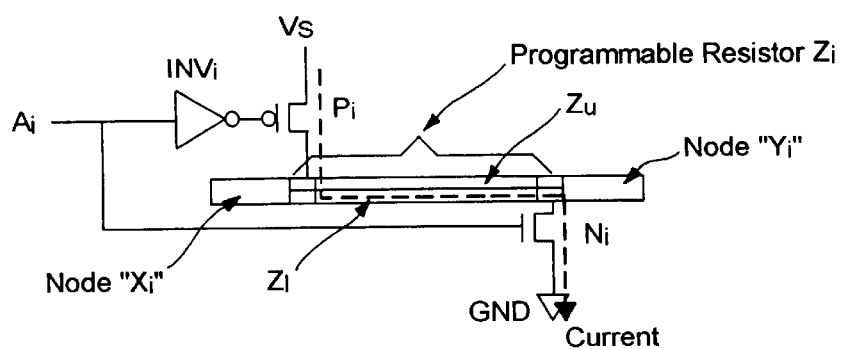
FIG. 4A depicts a programmable trimming resistor $Z_i$.

A second aspect of this invention is to use the same concept to trim resistor values electrically. "Trim" means to finely alter or adjust a resistance value to desired amount. As shown in FIG. 4A, a bi-layer resistor "$Z_i$" may be formed by at least two layers of different resistive material, e.g., Cu and Ni. The upper layer $Z_u$ which may be Ni, for example, lies on top of the lower layer $Z_l$, which could be Cu, in one exemplary embodiment. The order in which Cu or Ni are deposited, or other metal systems are selected and deposited, may be chosen to best fit any required metal interface requirements, depending on the desired chip interconnect structure characteristics.

To trim the resistance of bi-layer resistor $Z_i$, one may use PMOS device $P_i$ to connect one node ("$X_i$") of the resistor to a programming voltage. This voltage level may be the same, or it may be different than the existing power supply voltage $V_S$. The higher the voltage applied to node $X_i$ of bi-layer resistor $Z_i$, the shorter the programming time that will be required. However, a lower programming voltage may also be used to allow for more precise resistance trimming. The other node of the resistor ("$Y_i$") may be connected to a different voltage potential, e.g., ground, via NMOS device $N_i$.

The gates of these devices ($P_i$ and $N_i$) are preferably coupled to a program control pin $A_i$, which receives a programming control signal. With PMOS device $P_i$, inverter $INV_i$ is used for presenting the proper programming control signal value to the gate of $P_i$. During trimming, a controlled current will flow from the power supply through resistor $Z_i$ and to ground. Heat created by the current will act to anneal bi-layer resistor $Z_i$ to enhance inter-diffusion, and the resistance will be progressively reduced, or increased, depending on the material used, and the starting point on the resistivity curve for the particular material system being used. Trimming of the resistor can thus be accomplished under constant monitoring of the resistive value. When the resistance reaches a desired value, trimming may be stopped. Nodes $X_i$ and $Y_i$, represented in FIG. 4A, may be a metal or metals having known resistance(s), and which preferably are compatible with the particular manufacturing processes desired.

Figure 4B:
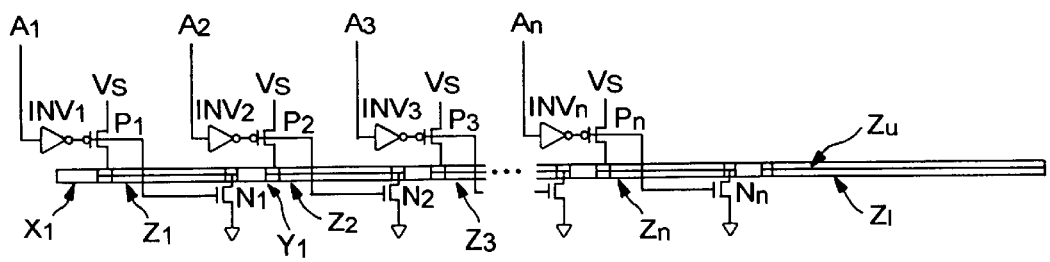
FIG. 4B depicts an embodiment having a series connection of a plurality of programmable trimming resistors, each being of the kind as shown in FIG. 4A.

Further extension of this structure may be made to an integrated circuit device, as depicted in FIG. 4B, where a series combination of "n" bi-layer resistors may be arranged and adjusted to, for example, match impedance along an radio frequency (RF) interconnect structure in an analog integrated circuit operating at RF, to prevent undesirable reflections and concomitant standing waves along the line, and thus enabling maximum power to be transferred to follow-on devices or elements. For example, the composite resistance of the bi-layer resistor may be shifted from 47Ω to 50Ω, to effect a match in impedance.

The invention being thus described in terms of preferred embodiments, it will be obvious that the same may be varied in many ways. Such variations are not to be regarded as a departure from the spirit and scope of the invention, and all such modifications as would be obvious to one skilled in the art are intended to be included within the scope of the following claims.

What we claim is:

1. A non-ablative method of programming an integrated circuit device, comprising:
   providing a programmable element including at least two conductive materials; and
   changing a resistance of the programmable element to a finite value,
   wherein said changing a resistance of the programmable element includes heating the programmable element.

2. The method of claim 1, wherein said heating the programmable element includes providing a current flow through the programmable element.

3. The method of claim 1, wherein said heating the programmable element includes directing a laser beam onto the programmable element.

4. The method of claim 1, wherein said heating the programmable element includes focusing one of an ion beam and an electron beam onto the programmable element.

5. The method of claim 1, wherein said providing a programmable element includes laminating the at least two conductive materials.

6. The method of claim 1, wherein said providing a programmable element includes laminating at least three conductive materials.

7. The method of claim 1, wherein said providing a programmable element includes providing a layer of Si.

8. The method of claim 7, further comprising doping the layer of Si.

9. The method of claim 7, wherein said providing a layer of Si includes providing a layer of polysilicon.

10. The method of claim 1, wherein said changing a resistance of the programmable element to a finite value includes increasing the resistance.

11. The method of claim 2, wherein said providing a current flow through the programmable element includes applying a pulsed current, wherein a number of current pulses determines the finite value.

12. A non-ablative method of programming an integrated circuit device, comprising:
    providing a programmable element including at least two conductive materials; and
    changing a resistance of the programmable element to a finite value,
    wherein said changing a resistance of the programmable element includes interdiffusing the at least two conductive materials.

13. A non-ablative method of programming an integrated circuit device, comprising:
    providing a programmable element including at least two conductive material; and
    changing a resistance of the programmable element to a finite value,
    wherein said changing a resistance of the programmable element includes forming an alloy of the at least two conductive materials.

14. A non-ablative method of programming an integrated circuit device, comprising:
    providing a programmable element including at least two conductive materials; and
    changing a resistance of the programmable element to a finite value,
    wherein said changing a resistance of the programmable element includes forming an alloy of Cu and Ni.

15. A non-ablative method of programming an integrated circuit device, comprising:
    providing a programmable element including at least two conductive materials; and
    changing a resistance of the programmable element to a finite value,
    wherein said providing a programmable element includes laminating at least three conductive materials.
    wherein said laminating at least three conductive materials includes sandwiching a layer of Ni between two layers of Cu.

16. A non-ablative method of programming an integrated circuit device, comprising:
    providing a programmable element including at least two conductive materials; and
    changing a resistance of the programmable element to a finite value,
    wherein said providing a programmable element includes forming a lamination of at least one pair of materials selected from the group consisting of Cu—Ni, Au—Pd, Au—Pt, and Au—Cu.

17. A non-ablative method of programming an integrated circuit device, comprising:
    providing a programmable element including at least two conductive materials; and
    changing a resistance of the programmable element to a finite value,
    wherein said changing a resistance of the programmable element to a finite value includes increasing the resistance,
    wherein said changing a resistance of the programmable element to a finite value includes increasing the resistance by less than an order of magnitude relative to an initial resistance of the programmable element.

18. A non-ablative method of programming an integrated circuit device, comprising:
  providing a programmable element including at least two conductive materials; and
  changing a resistance of the programmable element to a finite value,
  wherein said changing a resistance of the programmable element to a finite value includes increasing the resistance,
  wherein said changing a resistance of the programmable element to a finite value includes increasing the resistance by more than an order of magnitude relative to an initial resistance of the programmable element.

19. A non-ablative method of programming an integrated circuit device, comprising:
  providing a programmable element including at least two conductive materials;
  changing a resistance of the programmable element to a finite value; and
  providing a reference resistance element having a resistance approximately equal to an initial resistance of the programmable element.

20. A non-ablative method of programming an integrated circuit device, comprising:
  providing a programmable element including at least two conductive materials;
  changing a resistance of the programmable element to a finite value; and
  providing a reference resistance element, wherein an initial resistance of the programmable element is at least within 50% of a resistance value of the reference resistance element.

21. A non-ablative method of programming an integrated circuit device, comprising:
  providing a programmable element including at least two conductive materials;
  changing a resistance of the programmable element to a finite value,
  wherein said changing a resistance of the programmable element to a finite value includes decreasing the resistance by at least an order of magnitude relative to an initial resistance of the programmable element.

22. A programmable integrated circuit device, comprising:
  a bistable element;
  a variable resistance coupled to the bistable element;
  switching means for switching an output state of the bistable element in response to a sensed resistance value of the variable resistance.

23. The device of claim 22, wherein said variable resistance includes at least two conductive materials.

24. The device of claim 22, wherein said variable resistance is a laminate structure of at least two conductive materials at least while said programmable integrated circuit device is in a pre-programmed state.

25. The device of claim 22, wherein said variable resistance is an interdiffusion of at least two conductive materials.

26. The device of claim 22, wherein said variable resistance is an isomorphous solid solution of at least two conductive materials when said programmable integrated circuit device is in a programmed state.

27. The device of claim 22, wherein said variable resistance comprises at least two conductive materials.

28. The device of claim 22, wherein said variable resistance comprises a lamination of at least two conductive materials while said programmable integrated circuit device is in a pre-programmed state.

29. The device of claim 22, wherein said variable resistance comprises an alloy of at least two conductive materials when said programmable integrated circuit device is in a programmed state.

30. The device of claim 27, wherein said at least two conductive materials include Cu and Ni.

31. The device of claim 27, wherein said at least two conductive materials include at least two materials selected from the group consisting of Cu, Ni, Al, Ti, W, Pd, Pt, Au, Ag, and Si.

32. The device of claim 27, wherein said at least two conductive materials include Si.

33. The device of claim 32, wherein said Si is doped.

34. The device of claim 27, wherein said at least two conductive materials include Au and Ag.

35. The device of claim 27, wherein said at least two conductive materials include Au and Ni.

36. The device of claim 27, wherein said at least two conductive materials include Au and Pd.

37. The device of claim 27, wherein said at least two conductive materials include Au and Pt.

38. The device of claim 27, wherein said at least two conductive materials include Au and Cu.

39. The device of claim 22, wherein a programmed resistance value of the variable resistance is greater than an initial resistance value of the variable resistance by at least an order of magnitude.

40. The device of claim 22, wherein a programmed resistance value of the variable resistance is greater than an initial resistance value of the programmable element by less than an order of magnitude.

41. The device of claim 22, wherein a programmed resistance value of the variable resistance is less than a pre-programmed resistance value of the variable resistance by at least an order of magnitude.

42. The device of claim 22, wherein said switching means comprises:
  an output circuit;
  a precharge device;
  a set device; and
  a read device.

43. The device of claim 42, wherein said output circuit is a complementary output circuit.

44. The device of claim 42, wherein said output circuit is a single output circuit.

45. The device of claim 22, further comprising a reference resistance coupled to the bistable element and having a resistance approximately equal to an initial resistance of the programmable element.

46. A method of programming a programmable integrated circuit device including a bistable element, a programmable element including a lamination of at least two conductive materials coupled to the bistable element, a reference resistor coupled to the bistable element, said reference resistor having a resistance value approximately equal to an initial resistance value of the programmable element, an output circuit, a precharge device, a set device, and a read device, wherein a programmed state of the programmable integrated circuit device is determined by a resistance value of the programmable element, the method comprising:
  increasing an initial resistance of the programmable element by approximately an order of magnitude by interdiffusing the lamination of the at least two conductive materials;

triggering the set device;

latching a data value representing the programmed state into the bistable element;

triggering the read device; and reading the programmed state from the bistable element through the output circuit.

47. The method of claim 46, wherein said interdiffusing the lamination of the at least two conductive materials includes forming an alloy of Cu and Ni.

48. A variable resistor, comprising:

a resistive element, said resistive element including a first conductive material and a second conductive material in contact with said first conductive material, wherein a resistance of the variable resistor is determined at least in part by a relative amount of the second conductive material wit respect to an amount of the first conductive material in the resistive element, wherein said resistive element is an alloy of said first and second conductive materials.

49. The variable resistor of claim 48, wherein said resistive element comprises a lamination of said first conductive material and said second conductive material.

50. The variable resistor of claim 48, wherein said resistive element further comprises a third conductive material in contact with said second conductive material.

51. The variable resistor of claim 50, wherein said resistive element comprises a lamination having said second conductive material sandwiched between said first conductive material and said third conductive material.

52. The variable resistor of claim 51, wherein said first and third conductive materials are of a same type of material.

53. The variable resistor of claim 48, wherein said first and second conductive materials are Cu and Ni, respectively.

54. The variable resistor of claim 51, wherein said first and second conductive materials are Cu and Ni, respectively.

55. The variable resistor of claim 48, wherein said first and second conductive materials are selected from the group consisting of Cu, Ni, Al, Ti, W, Pd, Pt, Au, Ag, and Si.

56. The variable resistor of claim 50, wherein said resistive element is an alloy of said first, second, and third conductive materials.

57. A method of forming a variable resistor, comprising:

providing a first conductive material;

providing a second conductive material; and interdiffusing the first and second materials.

58. The method of claim 57, wherein said interdiffusing includes forming an alloy of said first and second conductive materials.

59. The method of claim 57, further comprising controlling a programmed resistance value of the variable resistor by providing said second conductive material in a specified amount relative to said first conductive material.

60. The method of claim 57, wherein said providing steps include laminating said first and second conductive materials.

61. The method of claim 57, wherein said interdiffusing step includes heating said first and second conductive materials.

62. The method of claim 61, wherein said heating includes providing an electrical current through said first and second conductive materials.

63. The method of claim 61, wherein said heating includes non-ablatively exposing a laser beam on said first and second conductive materials.

64. The method of claim 57, further comprising providing a second portion of said first conductive material in contact with said second conductive material.

65. The method of claim 64, further comprising laminating said second portion of said first conductive material, said first conductive material, and said second conductive material.

66. A resistance trimming device, comprising:

a bi-layer resistive element including a first conductive layer on a second conductive layer;

a pair of programming transistors, a first transistor of the pair being arranged between a first voltage and a first end of the bi-layer resistive element, a second transistor of the pair being arranged between a distal end of the bi-layer resistive element and a second voltage, wherein said first and second transistors conduct a current through the bi-layer resistive element sufficient to interdiffuse at least a portion of the first conductive layer with the second conductive layer in response to a programming signal applied to each of said first and second transistors, wherein a trimmed resistance value of the bi-layer resistive element is determined by a value of the current and a time duration of said programming signal.

67. The device of claim 66, further comprising a plurality of pairs of programming transistors, each pair of programming transistors being connected to said bi-layer resistive element at different respective locations than said first and said second transistors, wherein a trimmed resistance value of the bi-layer resistive element is determined by respective values of a plurality of currents through associated pairs of programming transistors and time durations of respective programming signals.

68. The device of claim 66, wherein said first conductive layer and said second conductive layer are Cu and Ni, respectively.

69. The method of claim 62, wherein said providing an electrical current includes applying a pulsed current, wherein a number of current pulses determines a resistance value of the variable resistor.

70. The resistance trimming device of claim 66, wherein said current through the bi-layer resistive element is a pulsed current, wherein a number of current pulses determines the trimmed resistance value of the bi-layer resistive element.

* * * * *